United States Patent [19]

Porter

[11] Patent Number: 4,736,270
[45] Date of Patent: Apr. 5, 1988

[54] BILATERAL SNAP-IN BACK PANEL RETAINER ASSEMBLY

[75] Inventor: Warren W. Porter, Escondido, Calif.
[73] Assignee: NCR Corporation, Dayton, Ohio
[21] Appl. No.: 27,361
[22] Filed: Mar. 18, 1987
[51] Int. Cl.⁴ ............................ H05K 7/12; H02B 1/02
[52] U.S. Cl. ................................ 361/415; 174/138 D;
 211/41; 361/399; 439/554
[58] Field of Search ................. 248/221.4; 439/59, 65,
 439/554; 211/41; 174/138 D; 361/395, 399,
 412, 413, 415, 426, 429, 417, 419

[56] References Cited

U.S. PATENT DOCUMENTS

| | | | |
|---|---|---|---|
| 3,197,731 | 7/1965 | Beale | 361/415 |
| 3,231,785 | 1/1966 | Calabro | 361/415 |
| 3,320,483 | 5/1967 | Pohl | 361/415 |
| 3,486,077 | 12/1969 | Oeler | 361/399 |
| 3,567,998 | 3/1971 | Ammerman | 361/399 |
| 3,777,052 | 12/1973 | Fegen | 174/138 D |
| 4,534,472 | 8/1985 | Hanseler | 361/415 |
| 4,664,458 | 5/1987 | Worth | 174/138 D |

Primary Examiner—G. P. Tolin
Attorney, Agent, or Firm—Wilbert Hawk, Jr.; Albert L. Sessler, Jr.; Richard W. Lavin

[57] ABSTRACT

A panel is mounted between parallel spaced apart frame members by a pair of retainer members having a length greater than the spacing between the frame members so as to project through selectively spaced openings in the frame members. Each of the retainers is provided with a slotted channel for receiving an edge of the panel. Opposing ends of the retainer are provided with a pair of bifurcated legs which may be flexed toward one another to permit the snapping of the retainer into the selectively spaced slots in the frame members. The retainers are movable within the slots during assembly to firmly engage opposite edges of the panel in the slotted channels. Electrical connectors may be mounted in the retainers' slotted channels to mate with electrical conductors on the panel.

5 Claims, 4 Drawing Sheets

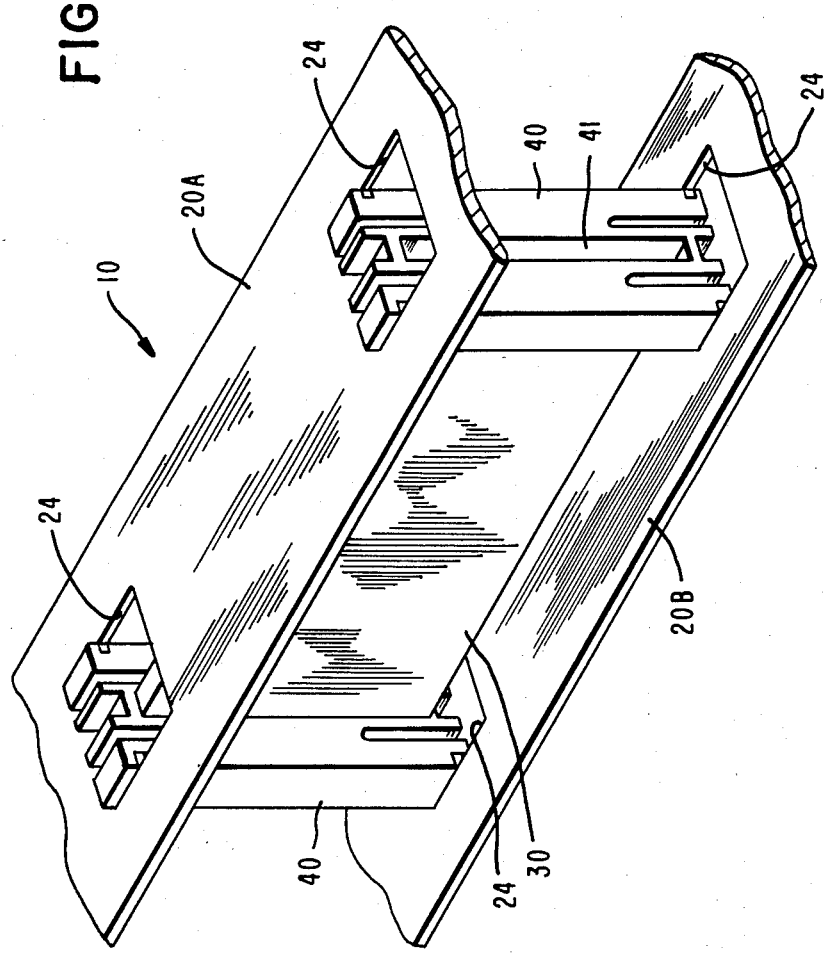

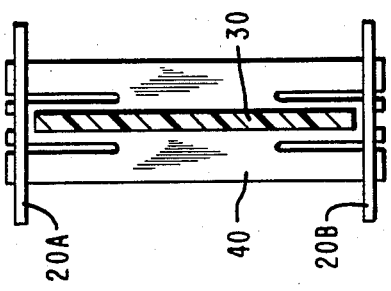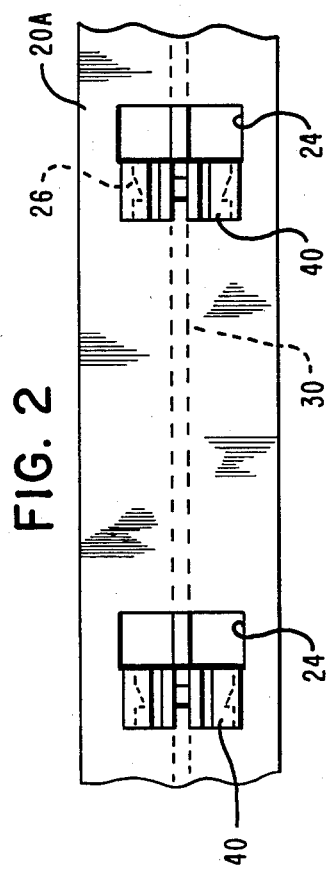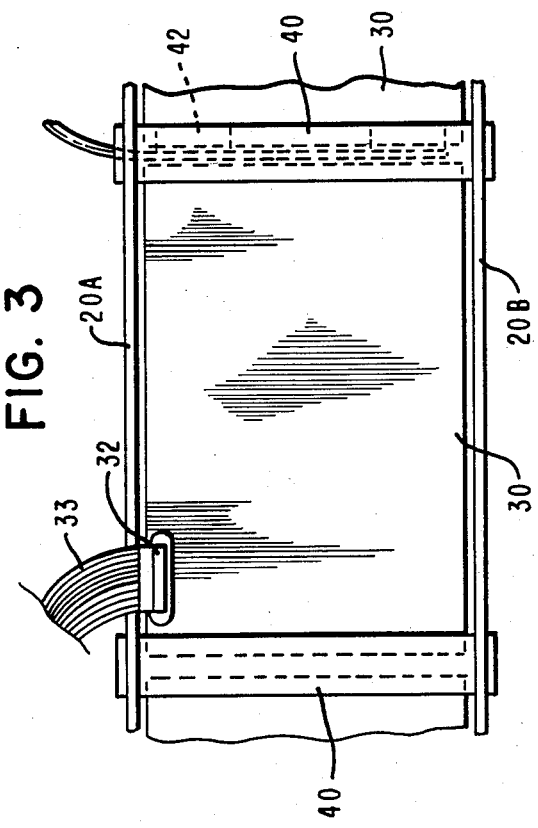

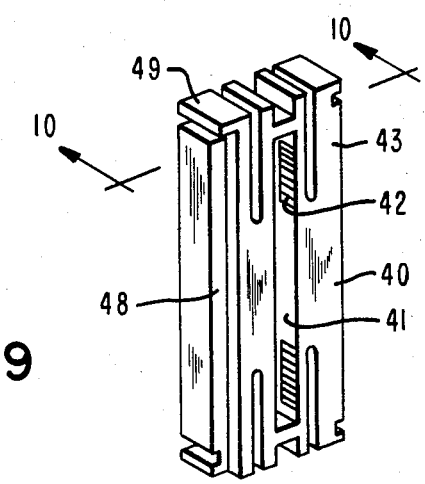
FIG. 9
FIG. 10
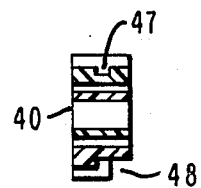
FIG. 11
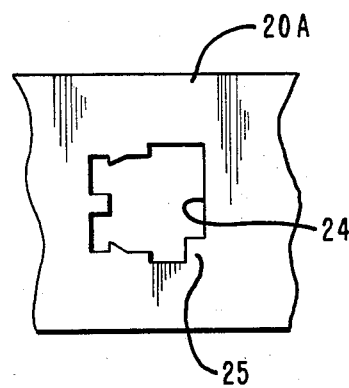

BILATERAL SNAP-IN BACK PANEL RETAINER ASSEMBLY

BACKGROUND OF THE INVENTION

Cabinet mounted electronic equipment utilizes back panels to which internal electronic components are coupled by way of electrical conductors to cabling that interconnects the electronic components of the one cabinet to electronic components mounted within another cabinet. These back panels have traditionally been mounted to the frame of the cabinet by means of fasteners such as screws. In order to reduce assembly cost, it is highly desirable to eliminate the use of these fastening devices. Conversely, if the panel is to be removed, the fastening devices have to be disconnected.

In U.S. Pat. No. 3,486,077 entitled "Assembly Having a Chassis and Removably Mounted Panels" by R. C. Oeler et al., there is disclosed a circuit board connected to a chassis using snap-in fasteners which are assisted by a screw-in type clamp for permitting quick assembly and disassembly of a circuit board from the chassis' frame.

Another patent of interest is U.S. Pat. No. 3,567,998 entitled "Corner Edge Connector for Printed Circuit Boards" by J. M. Ammerman. The invention is directed to a pair of L-shaped edge connectors which have a formed slotted channel for receiving the edges of a circuit board and wherein one leg of each connector is provided with snap-in couplers for securing the printed circuit board to a supporting structure. The L-shaped configuration of the edge connectors provides additional support to the circuit board to relieve the strain from the connector area.

SUMMARY OF THE INVENTION

This invention relates to back panel mounts and more particularly to a mounting assembly for mounting electrical back panels to cabinet components. In one preferred embodiment of the invention, the assembly includes parallel spaced apart frame members, each having selectively spaced slots and at least one panel which is to be mounted between the spaced apart frame members. A pair of retainer members is provided, each having a length greater than the spacing between the frame members and formed of a dielectric material having slotted channels therein for receiving the edges of the panel with opposing ends of the retainer being comprised of a pair of bifurcated legs which may be flexed towards one another to permit the snapping of the retainer into sets of the selectively spaced apart slots in the frame members. In a second embodiment of the invention, the retainer is provided with an electrical connector in its slotted channels which engages corresponding conductors on the edge of the panel.

Accordingly, it is an object of the present invention to provide a mounting assembly for mounting back panels of various length to a cabinet frame.

A further object of the present invention is to provide an assembly which reduces the amount of labor needed for assembly and disassembly.

Another object of the present invention is to provide a retainer which incorporates one or more electrical connectors for interfacing to the electrical connectors on a back panel.

These and other objects of the present invention will become more apparent when taken in conjunction with the following description and drawings wherein like characters indicate like parts and which drawings form a part of the present disclosure.

BRIEF DESCRIPTION OF THE DRAWINGS

FIG. 1 is a perspective view of the back panel retainer assembly in accordance with the present invention;

FIG. 2 is a top view of a panel mounted with a pair of retainers to a chassis frame;

FIG. 3 is a side view illustrating the back panel mounted to the spaced apart frame members by a pair of retainers. Also shown in partial form are the edges of two adjacent back panels;

FIG. 4 is a end view of the assembly shown in FIGS. 2 and 3;

FIG. 9 is a perspective view of another embodiment of a back panel retainer;

FIG. 10 is a sectioned view of the back panel retainer taken along the section lines 10—10 of FIG. 9; and FIG. 11 is a view of a keyed slot formed in one of the frame members with the frame member cut-off.

DETAILED DESCRIPTION OF THE PREFERRED EMBODIMENTS

Figure 6:
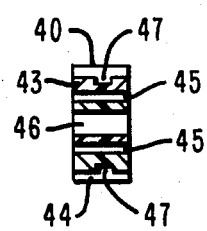
FIG. 6 is a sectioned view of the back panel retainer taken along the section lines 6—6 of FIG. 5.

Referring to FIG. 1, the back panel retainer assembly 10 is comprised of two parallel spaced apart frame members 20A and 20B, a pair of retainers 40 and a panel 30. Each of the spaced apart frame members contains a plurality of selectively spaced slots 24. Projecting through the slots 24 are the ends of the retainer member 40 which ends are adapted to snap into place within the slots 24. Each retainer member has a pair of opposing channels 41 for receiving an end of the panel 30. In FIG. 1 only one panel and one pair of retainers are illustrated, but it is to be understood that a series of panels may be mounted to the frame members 20A and 20B by replicating the retainers 40 along with the slots 24 along the length of the frame and that the distance between the slots 24 may be varied so as to accommodate different length back panels.

Referring now to FIGS. 2, 3, and 4, the frame members 20A and 20B each has the same shaped slots 24. The slots are rectangular in shape with inwardly projecting barbs 26 commencing at a distance within the slot corresponding to the thickness of the retainer member. To mount a panel between the frames a first retainer is inserted through the slots 24 in the upper and the lower frame members 20A and 20B, respectively. When a first retainer is aligned the retainer is urged forward so as to lockably engage the barbs 26. The panel 30 is then inserted into the channel 41 and a second retainer is then inserted through the slots 24 and urged towards the barbs 26 and locked into place thereby rigidly mounting the back panel between the first and second frame members.

In a second embodiment of the invention the retainer member 40 is provided with one or more electrical connectors 42 that may be mounted in the channel 41 so as to accommodate corresponding electrical conductors on the edge of the back panel. Additionally flex conductors 33 may be connected to the panel 30 utilizing a standard connector 32 in a well known manner.

Figure 7:
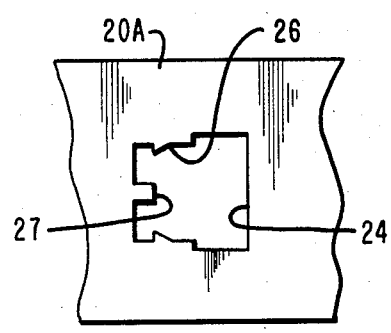
FIG. 7 is a view of the slot formed in one of the frame members with the frame member cut-off.
Figure 8:
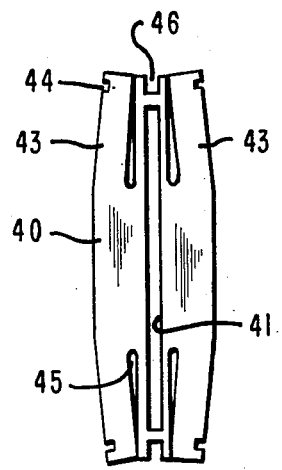
FIG. 8 is an action drawing of the back panel retainer illustrating the position of the bifurcated legs in the squeezed together position.
Figure 5:
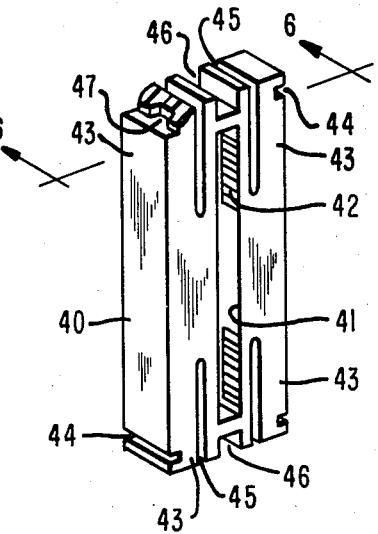
FIG. 5 is a perspective view of a back panel retainer, partially cut away.

Referring to FIG. 5, the retainer 40 is provided with opposing slotted channels 41 with the opposing ends of the retainer comprised of a pair of bifurcated legs 43, which as shown in FIG. 8, may be flexed towards one another to permit the snapping of the retainer into the selectively spaced slots 24. Notches 45 are cut into the ends of the retainer to facilitate their bending. Additional notches 44 are cut across the ends of the legs 43 with a thickness corresponding to the thickness of the frame members 20A and 20B. Within the notches 44 is a second transverse notch 47, shown more clearly in FIG. 5 at the cutaway portion and in the sectioned view of FIG. 6. The barbs 26 of the frame members 20A and 20B are formed, as shown in FIG. 7, such that the point of the barb fits into the transverse notch 47. An indexing notch 46 is provided in the central body portion of the retainer 40 which indexing notch mates with a projecting tab 27, shown clearly in FIG. 7. With the retainer locked to the frame member the tab 27, in conjunction with the notch 46, prevents movement of the retainer along its long axis thus restraining the back panel from lateral movement.

In one construction of the retainer the retainer is symmetrical about all axes such that it may be used upside down to perform the same function. The material for constructing the retainer should be somewhat flexible but yet rigid enough to provide adequate support to the panel member and should ideally be of a dielectric material if electrical circuitry is associated with the panel.

A panel may be removed from between the two frame members by squeezing the bifurcated legs together at the top and the bottom ends, thereby disengaging the barb projection 26 from the recess 47, so as to enable the retainer to be moved along the long direction of the opening 24. The removal of one retainer will permit the removal of the panel.

Referring to FIG. 9, the retainer 40 is provided with an indexing notch 48 which extends along one edge of the retainer member 40 and which mates with an indexing projection 25 formed in the selectively spaced slots 24 shown in FIG. 11. One end 49 of the bifurcated leg 43 containing the indexing notch 48 is not notched to further aid in the proper orientation of the retainer 40 within the slot 24. The indexing notch 48 is used when the orientation of the electrical connector 42, within the channel 41, is critical with respect to the electrical conductors on the edges of the back panels. In FIG. 10, the position of the notch 48, in the retainer 40, is shown by the section view taken along the section line 10—10 in FIG. 9. The transverse notch 47 on the leg opposite the notch 48 is left untouched but the matching notch on the leg with the notch 48 is partially removed to provide the required clearance for full insertion of the retainer.

While there have been shown what are considered to be the preferred embodiments of the invention, it will be manifest that many changes and modifications can be made therein without departing from the essential spirit and scope of the invention. It is intended, therefore, in the annexed claims, to cover all such changes and modifications which may fall within the true scope of the invention.

I claim:

1. An assembly including in combination:
   parallel spaced apart frame members having selectively spaced aligned first slots therein in which are located a pair of inwardly projecting edge barb portions;
   at least one panel member mounted between said spaced apart frame members; and
   retainer members extending between said frame members and mounted in each of said aligned slots, each of said retainer members being formed of a dielectric material with a slotted channel extending along its longitudinal axis receiving an edge of said panel member, said retainer members each further comprising a pair of bifurcated opposite end leg portions which are flexed toward one another and thereby snap each of said retainer members into said selectively spaced aligned first slots, said leg portions including a pair of second slots extending along the outer edge of each of the leg portions removably engaging the edges of the selectively spaced aligned first slots of the frame members, said second slots including a recess portion removably receiving the projecting edge barb portions of said selectively spaced aligned first slots thereby locking the retainer members into engagement with said aligned first slots.

2. The assembly of claim 1 wherein said selectively spaced aligned first slots are generally rectangular in shape and have a pair of long sides such that the retainer member positioned on one edge of said panel is movable within the slot towards the retainer member on the opposite edge along the direction of said long sides to lock said opposite edges of said panel in said slotted channels.

3. The assembly of claim 2 wherein said selectively spaced aligned first slots are further comprised of an inwardly projecting tab portion, and each of said retainer members further includes a third slot located in the ends of said retainer member for engagement with the projection tab portion of said selectively spaced aligned slots for preventing the axial movement of said retainer member between said frame members.

4. The assembly of claim 3 and further comprising: panel electrical edge conductors mounted on said panel; and mating electrical edge conductors mounted within the slotted channels of said retainer members engaging said panel electrical edge conductors.

5. The assembly of claim 1 in which each said retainer further includes electrical edge conductors positioned within the slotted channel engaging electrical conductors positioned on the edge of the electrical panel positioned in the slotted channel.

* * * * *